United States Patent
Elizondo-Decanini et al.

(10) Patent No.: US 9,472,689 B1
(45) Date of Patent: Oct. 18, 2016

(54) VARACTOR WITH INTEGRATED MICRO-DISCHARGE SOURCE

(71) Applicant: Sandia Corporation, Albuquerque, NM (US)

(72) Inventors: Juan M. Elizondo-Decanini, Albuquerque, NM (US); Ronald P. Manginell, Albuquerque, NM (US); Matthew W. Moorman, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 14/843,060

(22) Filed: Sep. 2, 2015

(51) Int. Cl.
| | |
|---|---|
| H01L 29/93 | (2006.01) |
| H01L 29/66 | (2006.01) |
| H01L 29/20 | (2006.01) |
| H01L 29/16 | (2006.01) |
| H01L 29/06 | (2006.01) |
| H01L 27/08 | (2006.01) |

(52) U.S. Cl.
CPC .......... *H01L 29/93* (2013.01); *H01L 27/0808* (2013.01); *H01L 29/0657* (2013.01); *H01L 29/1608* (2013.01); *H01L 29/2003* (2013.01); *H01L 29/66174* (2013.01)

(58) Field of Classification Search
CPC .................... H01L 27/0808; H01L 29/66174; H01L 29/93
See application file for complete search history.

(56) References Cited

U.S. PATENT DOCUMENTS

| | | | | |
|---|---|---|---|---|
| 3,636,420 | A * | 1/1972 | Vendelin | H01L 29/00 148/DIG. 31 |
| 4,916,716 | A * | 4/1990 | Fenner | H01L 23/051 257/480 |
| 5,789,801 | A * | 8/1998 | Stoneham | H01L 29/93 257/596 |
| 6,803,269 | B2 | 10/2004 | Coolbaugh et al. | |
| 7,545,007 | B2 | 6/2009 | Greer et al. | |
| 7,560,798 | B2 | 7/2009 | Nowak | |
| 8,242,581 | B1 | 8/2012 | Ratnakumar et al. | |
| 9,076,771 | B2 * | 7/2015 | Li | H01L 23/481 |
| 2007/0126083 | A1 * | 6/2007 | Suzuki | H01L 24/32 257/595 |
| 2014/0008732 | A1 | 1/2014 | Hyvonen et al. | |
| 2014/0196520 | A1 | 7/2014 | Marta et al. | |
| 2016/0079444 | A1 * | 3/2016 | Wright | H01L 29/93 257/599 |

* cited by examiner

*Primary Examiner* — Benjamin Sandvik
(74) *Attorney, Agent, or Firm* — Medley, Behrens & Lewis, LLC; Aman Talwar

(57) ABSTRACT

An apparatus that includes a varactor element and an integrated micro-discharge source is disclosed herein. In a general embodiment, the apparatus includes at least one np junction and at least one voltage source that is configured to apply voltage across the np junction. The apparatus further includes an aperture that extends through the np junction. When the voltage is applied across the np junction, gas in the aperture is ionized, forming a plasma, in turn causing a micro-discharge (of light, charge particles, and space charge) to occur. The light (charge particles, and space charge) impinges upon the surface of the np junction exposed in the aperture, thereby altering capacitance of the np junction. When used within an oscillator circuit, the effect of the plasma on the np-junction extends the capacitance changes of the np-junction and extends the oscillator frequency range in ways not possible by a conventional voltage controlled oscillator (VCO).

20 Claims, 7 Drawing Sheets

US 9,472,689 B1

VARACTOR WITH INTEGRATED MICRO-DISCHARGE SOURCE

STATEMENT OF GOVERNMENTAL INTEREST

This invention was developed under Contract DE-AC04-94AL85000 between Sandia Corporation and the U.S. Department of Energy. The U.S. Government has certain rights in this invention.

BACKGROUND

A varactor is a type of diode that behaves as a variable capacitor when operated in reverse bias. With more particularity, a varactor includes an np semiconductor junction, wherein capacitance of the junction is a function of voltage applied across the junction. Specifically, the capacitance of the np junction (and thus the varactor) decreases as the reverse voltage across the np junction increases.

Varactors are conventionally designed to conform to a voltage-dependent capacitance response curve, where the curve can be tailored to a specific range of values (e.g., both in voltage and resulting capacitance) as a function of the semiconductor material of the varactor, amplitude of the voltage applied across the np junction, and frequency of the voltage applied across the np junction. Varactors are typically found in electronic equipment where tuning is desired; specifically, a varactor is typically placed in parallel with an inductor to form a resonant frequency circuit, as such they are known as "voltage controlled oscillators" (VCO's). When the reverse voltage across the np junction of the varactor changes, the resonant frequency of the tuning device (the combination of the varactor and inductor) likewise changes. With the inductor value typically constant, the frequency range for the oscillator is dependent and limited by the varactor capacitance to voltage range.

From the above, it can be ascertained that it is desirable to allow for as much flexibility as possible with respect to capacitance values that can be achieved by the varactor, and it is further desirable to cause the varactor to reach a desired capacitance as quickly as possible. Conventionally, however, there are few suitable solutions to allow for the shifting of the voltage-dependent capacitance curve of semiconductor materials when used as varactors.

SUMMARY

Various technologies pertaining to varactors are disclosed herein. In a general embodiment, a varactor can include a layer of n-type material, a layer of p-type material, and an np junction formed between the layer of n-type material and the layer of p-type material. The varactor can additionally include an aperture that extends at least partially through the n-type material, at least partially through the p-type material, and entirely through the np junction. Accordingly, a portion of the np junction is exposed in the aperture. A gas is disposed in the aperture of the varactor, wherein the gas can be air, argon, or other suitable gas. A voltage source is configured to apply a voltage across the np junction of the varactor. In operation, the voltage applied across the np junction causes the gas disposed in the aperture to become ionized, further resulting in formation of plasma. Given sufficient voltage, a micro-discharge occurs, where photons are isotropically emitted in the aperture. In other words, a burst of light is generated in the aperture.

In another embodiment, capacitance of the np junction can be controlled as a function of amplitude and frequency of the voltage across the np junction applied by the voltage source, and can further be controlled as a function of intensity and frequency of light, charge particles, and space charge density (provided and emitted in the micro-discharge). More specifically, photons, and charge particles formed and emitted during the micro-discharge impinge upon and/or are injected into the exposed portion of the np junction in the aperture, which in turn modifies capacitance of the np junction. Likewise, as referenced above, the amplitude and frequency of voltage across the np junction applied by the voltage source also affects the capacitance of the np junction. The applied voltage and the micro-discharge can be used in combination to effectuate a nonlinear alteration in capacitance of the np junction, thereby producing an increase in the oscillator frequency range.

In yet another embodiment, an apparatus can include an np junction that forms a portion of a varactor, as well as an np junction that operates as a separate micro-discharge source. With more detail, the apparatus can include a layer of n-type material, a layer of p-type material (with an np junction formed therebetween), and an aperture that extends through the layers of material and the np junction. The apparatus can also include a voltage source that applies a first voltage across the np junction, in order to change capacitance of the np junction. The apparatus can further include a second np junction (e.g., stacked on the np junction), where the aperture extends through the second np junction. In this exemplary embodiment, a second voltage source can be configured to apply a second voltage across the second np junction, where the second voltage is applied to cause a micro-discharge to occur in the aperture. Photons, charge particles, and space charge generated during such micro-discharge impact a portion of the np junction exposed in the aperture. Put differently, the micro-discharge generated in the aperture proximate the second np junction emits photons and charge particles that impact (and/or interact by injection or space charge effects) an exposed portion of the first np junction, thereby varying capacitance of the np junction. The second voltage applied across the second np junction can be configured to cause micro-discharges to have certain intensities and to occur at a certain frequency. Thus, the first voltage applied by the first voltage source alters capacitance of the np junction, and the second voltage applied by the second voltage source causes a micro-discharge to occur, which also impacts capacitance of the np junction. It can, therefore, be understood that several np junctions can be stacked on top of one another, where one or more of such np junctions is configured to generate micro-discharges, and other np junctions in the stack are included in varactors.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

Additional features and advantages are described herein, and will be apparent from the following Detailed Description and the figures.

DETAILED DESCRIPTION

Figure 1:
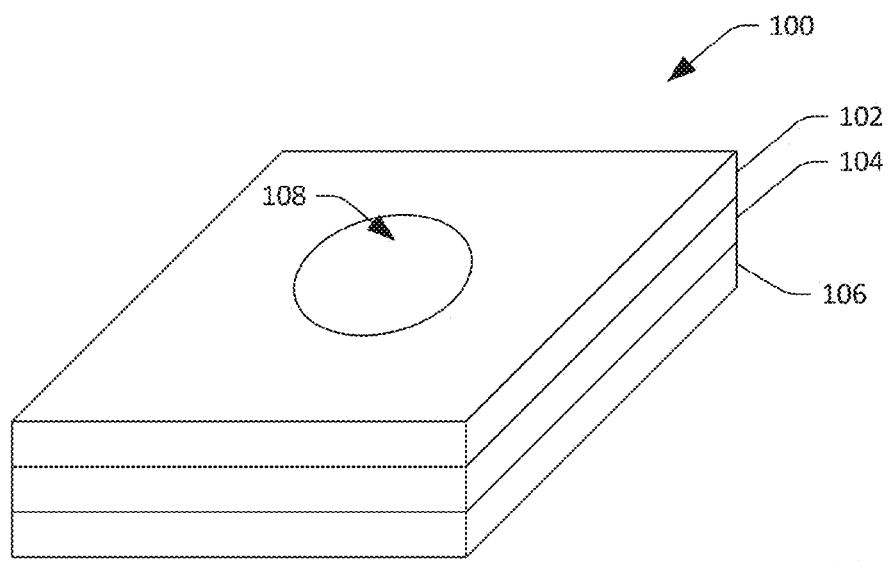
FIG. 1 is an isometric view of an exemplary varactor.

Technologies pertaining to varactors are disclosed herein. With reference now to FIG. 1, in a general embodiment, an exemplary varactor 100 is illustrated. The varactor 100 may be included in an electronic device, such as a semiconductor chip (which can be included in a mobile telephone, a television, a wireless computing device (e.g., a tablet computing device, a laptop computing device, a wearable computing device, etc.)). For example, the varactor 100 may be electrically coupled with an inductor to form a resonant frequency circuit, wherein capacitance of by the varactor 100 can be modified to alter the resonant frequency of the resonant frequency circuit.

The varactor 100 includes a layer of n-type material 102, a layer of p-type material 104, and an np junction 106 formed between the layer of n-type material 102 and the layer of p-type material 104. In non-limiting examples, the layer of n-type material 102, the layer of p-type material 104, and the np junction 106 can be formed of any suitable semiconductor material, such as an ultra-wide bandgap (UWBG) semiconductor material. Exemplary semiconductor materials that can be used to form the layers of the varactor 100 include, but are not limited to, Metal-oxides, Si, GaAs, SiO, SiC, AlN, and GaN.

The varactor 100 also includes an aperture 108 that extends at least partially through the layer of n-type material 102, at least partially through the layer of p-type material 104, and entirely through the np junction 106. The aperture 108 may be cylindrical in nature, cubic in nature, conical in nature, or any other suitable shape that results in at least a portion of the np junction 106 being exposed in the aperture 108. Further, while the aperture 108 is illustrated in FIG. 1 as extending entirely through the layer of n-type material 102, the np junction 106, and the layer of p-type material 104, the aperture 108 may only extend partially through the layer of p-type material 104, such that the aperture 108 is a recess with a conical base.

A gas is disposed in the aperture 108 (e.g., the aperture 108 is not filled with a solid, such as a ceramic). The gas disposed in the aperture 108 can be any suitable gas, such as air, argon, or the like. If the gas disposed in the aperture 108 is other than air, the varactor 100 may be sealed in a chamber, such that air is unable to displace the desired gas in the aperture 108.

Figure 2:
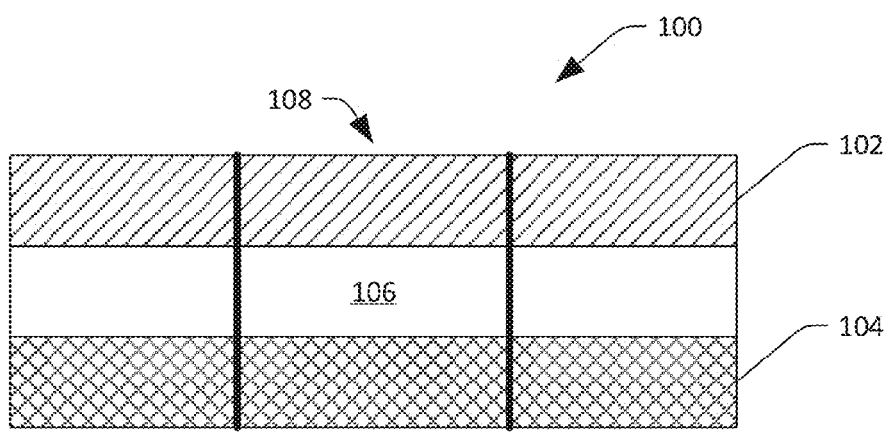
FIG. 2 is a cross-sectional view of the exemplary varactor.

With reference to FIG. 2, a cross-sectional view of the exemplary varactor 100 is illustrated. As can be ascertained in FIG. 2, at least a portion of the np junction is exposed in the aperture 108, such that inside the aperture 108, the gas disposed therein is adjacent the exposed portion of the np junction 106.

Figure 3:
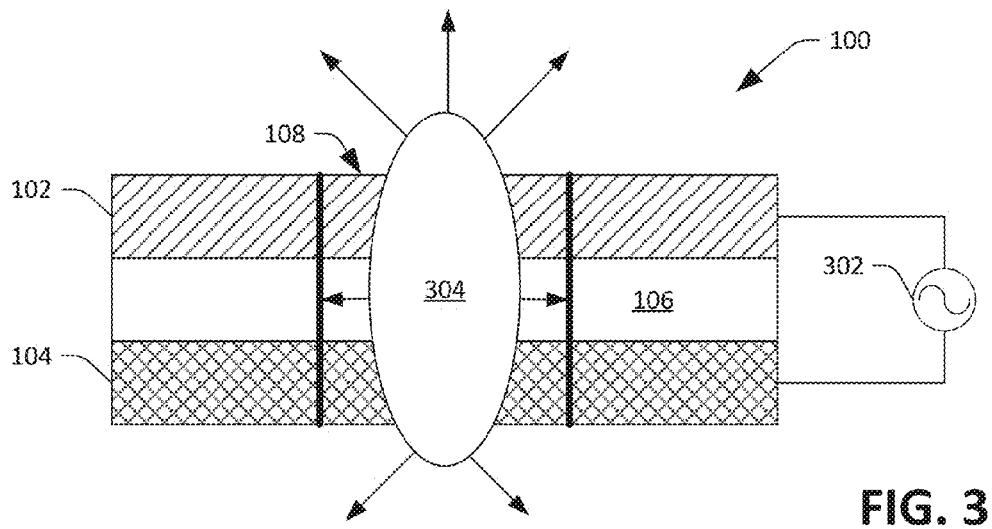
FIG. 3 is a cross-sectional view of an exemplary varactor, where a voltage source is configured to apply a voltage across an np junction of the varactor.

Now referring to FIG. 3, another exemplary cross-sectional view of the exemplary varactor 100 is illustrated. A voltage source 302 is configured to apply a voltage across the np junction 106 (e.g., with a controlled frequency and amplitude). More specifically, the voltage source 302 can be electrically coupled to the layer of n-type material 102 and the layer of p-type material 104 by way of suitable contacts. The voltage source 302 can supply a sufficiently high voltage to ionize the gas disposed in the aperture 108 of the varactor 100. This results in formation of a plasma 304 in the aperture 108, thereby causing a micro-discharge of photons (light), charged particles, and consequently space charge effects. The photons are emitted isotropically in the aperture 108 of the varactor 100, as indicated by the arrows in FIG. 3. Accordingly, some photons in the micro-discharge exit the aperture 108, and some photons in the micro-discharge will impact the exposed portion of the np junction 106 in the aperture 108.

The photons, charge particles, and space charge impacting the exposed portion of the np junction 106 in the aperture 108 cause the capacitance of the np junction 106 to alter. Photons, charge particles, and space charge impinging upon the surface of the np junction 106 in the aperture induce photo-carriers in the np junction 106, which change the carrier distribution in the np junction 106; therefore, the capacitance of the np junction is changed. Additionally, the amplitude and frequency of the voltage applied across the np junction 106 by the voltage source 302 also causes the capacitance of the np junction 106 to alter. Therefore, another axis of control is provided when setting the capacitance of the varactor 100. In fact, the utilization of the micro-discharge to alter capacitance of the np junction 106 can transform an intentionally linear voltage-dependent capacitance response (or curve) of the np junction into a nonlinear voltage-dependent curve.

The semiconductor material (and the np junction design and structure) used to form the varactor 100 can be selected based upon its voltage-dependent capacitance curve; and the gas disposed in the aperture 108 of the varactor 100 can be selected as a function of frequency of light emitted during a micro-discharge (e.g., which may be selected as a function of the bandgap of the semiconductor material). The intensity of the micro-discharge can be controlled by an amplitude and frequency of the voltage applied across the np junction 106 by the voltage source 302. This utilization of two control parameters to set the capacitance of the np junction 106 of the varactor 100 can allow for a desired capacitance to be reached more quickly when compared to conventional varactors, thereby allowing, for example, a resonant circuit that includes the varactor 100 to reach its resonant frequency more quickly when compared to conventional resonant circuits.

Figure 4:
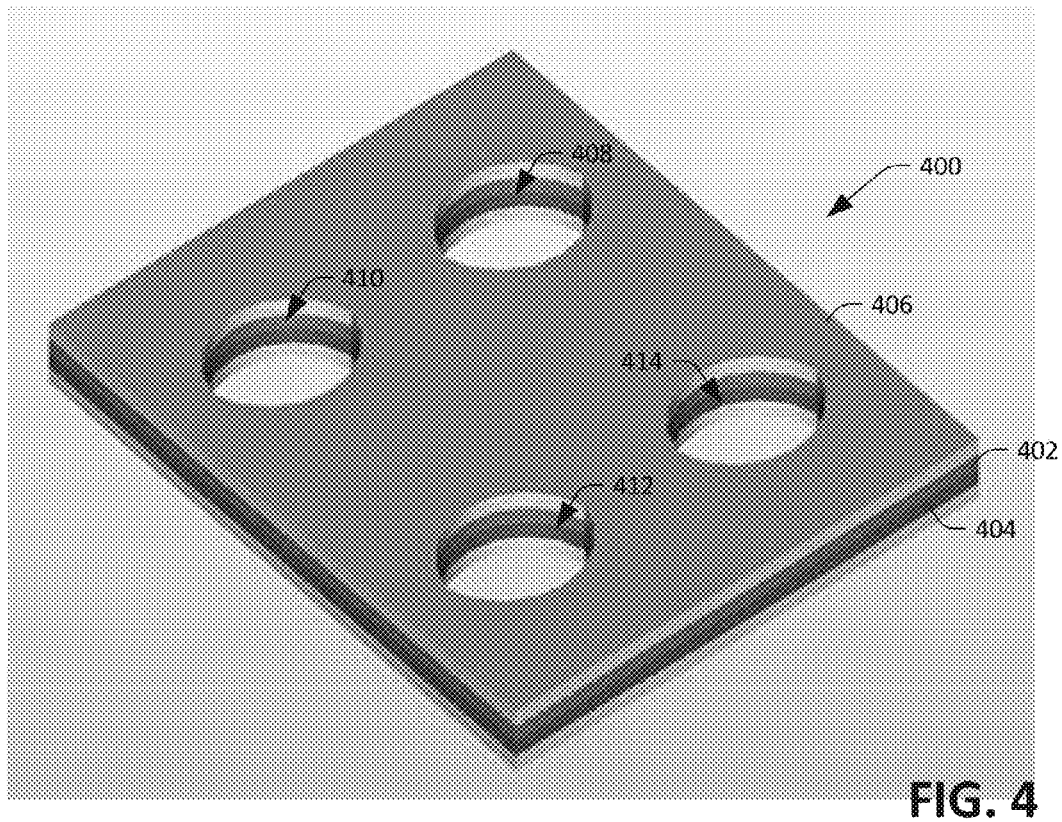
FIG. 4 is an isometric view of another exemplary varactor.

With reference now to FIG. 4, an isometric view of another exemplary varactor 400 is illustrated. The varactor 400 includes a layer of n-type material 402 and a layer of p-type material 404 adjacent the layer of n-type material 402, such that an np junction is formed between the layer of n-type material 402 and the layer of p-type material 404. The exemplary varactor 400 also includes a glass envelope 406 that is adjacent to both the layer of n-type material 402 and the layer of p-type material 404. The glass envelope 406 can act as a protective seal for the semiconductor material. In alternative embodiments, the envelop 406 can be formed of a dielectric, ceramic and/or a semiconductor material.

The exemplary varactor 400 also comprises a plurality of apertures 408-414, wherein each of the apertures 408-414 are illustrated as extending entirely through the glass envelope, the layer of n-type material 402, and the layer of p-type material 404 (and thus entirely through the np junction). Inclusion of multiple apertures in the varactor 400 allows for (simultaneous) formation of micro-discharges in the apertures 408-414, thereby enhancing the effect of capacitance change caused by photons impinging upon exposed portions of the np junction in the apertures 408-414. While the exemplary varactor 400 is illustrated as including four apertures 408-414, it is to be understood that a varactor may include any suitable number of apertures (e.g., fewer or more than four).

Figure 5:
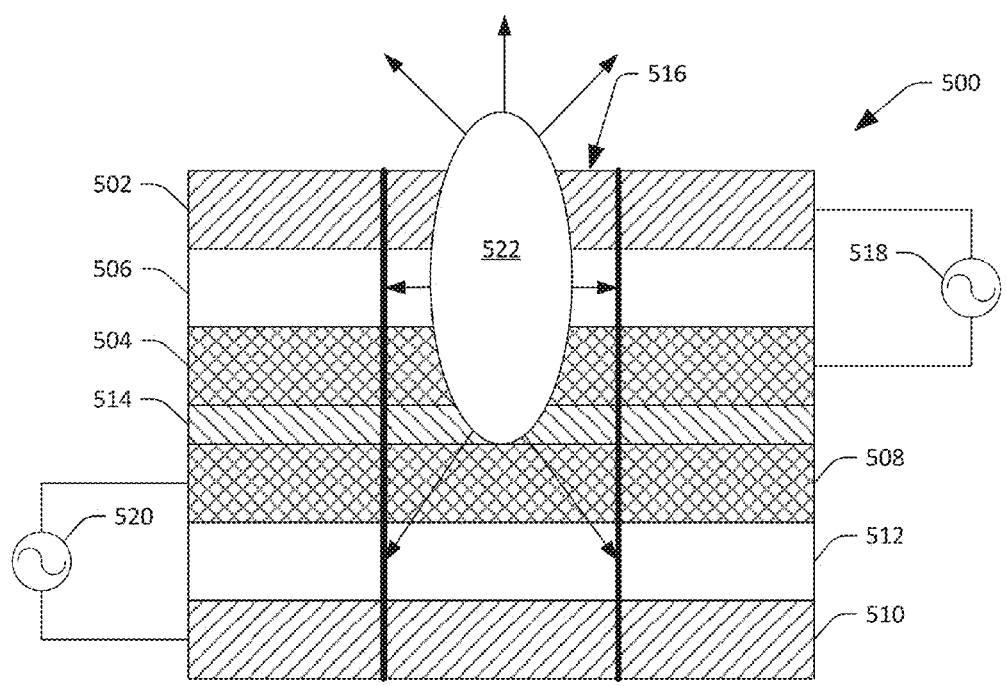
FIG. 5 is a cross-sectional view of an apparatus that includes a varactor integrated therein.

Now referring to FIG. 5, an exemplary apparatus 500 that includes an integrated varactor is illustrated. The exemplary apparatus includes a layer of p-type material 502, a layer of n-type material 504, and an np junction 506 formed between the layer of p-type material 502 and the layer of n-type material 504. The exemplary apparatus 500 also includes a second layer of n-type material 508, a second layer of p-type material 510, and a second np junction 512 formed between the second layer of n-type material 508 and the second layer of p-type material 510. The apparatus 500 may also optionally include a layer of dielectric material 514 disposed between the layer of n-type material 504 and the second layer of n-type material 508. The apparatus 500 further comprises an aperture 516 that extends through the layer of p-type material, the np junction 506, the layer of n-type material 504, the layer of dielectric material 514, the second layer of n-type material 508, the second np junction 512, and the second layer of p-type material 510. While the layers of the apparatus 500 are shown and described in a certain order (e.g. p-n-n-p), other orders are contemplated. For instance, the layers shown as being p-type material in FIG. 5 may instead be formed of n-type material, and layers of p-type material in FIG. 5 may instead be layers of n-type material. In any event, the apparatus 500 includes at least two np junctions stacked on top of one another, wherein the aperture 516 extends through both of such np junctions. As will be described herein, the second np junction 512 can act as a varactor.

A first voltage source 518 is electrically coupled to the layer of p-type material 502 and the layer of n-type material 504, such that the first voltage source 518 is configured to apply a first voltage across the np junction 506. A second voltage source 520 is electrically coupled to the second layer of n-type material 508 and the second layer of p-type material 510, such that the second voltage source 520 is configured to apply a second voltage across the second np junction 512. Accordingly, voltages (e.g., voltage amplitudes and frequencies) across the np junctions 506 and 512 can be controlled independently.

In the example shown in FIG. 5, the first voltage source 518 is configured to apply a first voltage across the np junction 506, such that a plasma 522 is formed in the aperture 516, resulting in a micro-discharge. As shown by the arrows, at least some photons emitted during the micro-discharge impinge upon a surface of the second np junction 512 exposed in the aperture 516, thereby affecting the capacitance of the second np junction 512. The second voltage source 520 is configured to apply a second voltage (e.g., with a desired amplitude and frequency) across the second np junction 512, thereby further affecting the capacitance of the second np junction 512. In other words, the light in the micro-discharge can be independently controlled from the voltage used to alter the capacitance of the second np junction 512. Capacitance of the second NP junction 512 can be used to control resonant frequency of a resonant frequency circuit, for example.

Further, materials of the np junctions 506 and 512 can be independently selected, such that the np junction 512 acts as a varactor with a desired voltage-dependent capacitance curve. Moreover, gas disposed in the aperture 516 can be selected to cause a micro-discharge to have a particular frequency—e.g., the gas can be selected based upon the material of the np junction 506.

Furthermore, the first voltage source 518 can be controlled to output a voltage of particular amplitude and frequency, thereby generating micro-discharges of desired amplitude at desired frequencies (which in turn affect capacitance of the second np junction 512). Additionally, the varactor 500 can be placed under pressure, wherein the capacitance of the second np junction 512 may be a function of such pressure. It can, therefore, be ascertained that a variety of variables can be controlled to effectuate a desired (potentially) nonlinear voltage-dependent capacitance curve for the second np junction 512.

Figure 6:
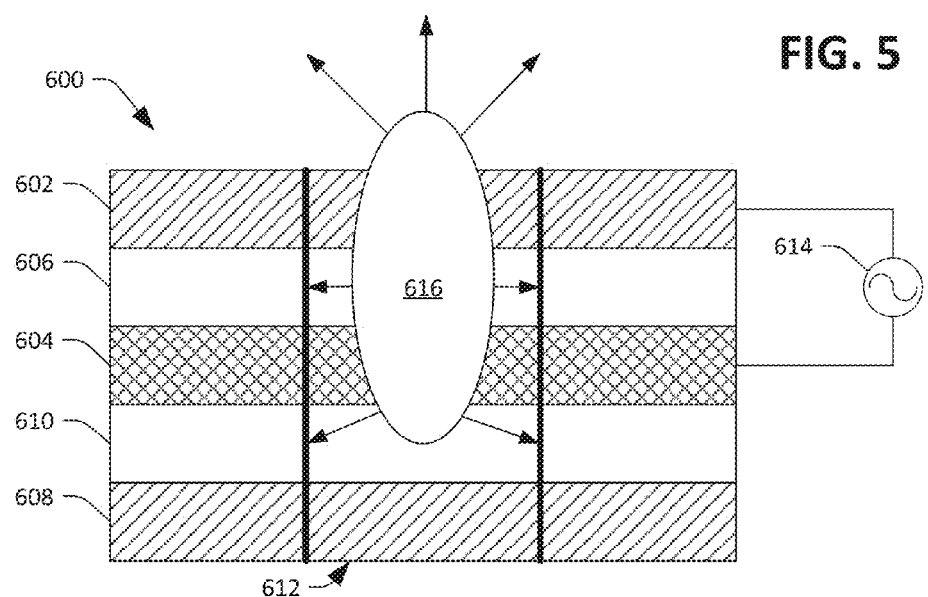
FIG. 6 is a cross-sectional view of another exemplary apparatus that includes an integrated varactor.

Now referring to FIG. 6, a cross-sectional view of yet another exemplary apparatus 600 is illustrated, wherein the apparatus is configured as a varactor having a micro-discharge source integrated therewith. The exemplary apparatus 600 includes a layer of p-type material 602, a layer of n-type material 604, and an np junction 606 formed between the layer of p-type material 602 and the layer of n-type material 604. The exemplary apparatus 600 also includes a second layer of p-type material 608 and a second np junction 610 formed between the layer of n-type material 604 and the second layer of p-type material 608. The exemplary apparatus 600 additionally includes an aperture 612 that extends through the layers of the apparatus 600. As described above, a gas is disposed in the aperture 612. A voltage source 614 applies a voltage (with a controlled frequency and amplitude) across the np junction 606, thereby periodically causing a plasma 616 to be formed in the aperture 612. In turn, this results in micro-discharges, such that photons, charge particles, and space charge are isotropically emitted in the aperture 612. As illustrated, at least some of the photons, charge particles, and space charge impinge upon a surface of the second np junction 610 that is exposed in the aperture 612, thereby changing capacitance of the second np junction 610. Thus, the second np junction 610 can act as a varactor, and the second layer of p-type material 608 can be contacted to take a signal out from the second np junction 610.

While the varactor 600 has been illustrated as having a particular configuration (e.g., the layers of materials arranged as p-n-p), it is be understood that the arrangement may be different (e.g., n-p-n). Further, the apparatus 600 may include more apertures and/or additional np junctions stacked on top of one another.

Figure 7:
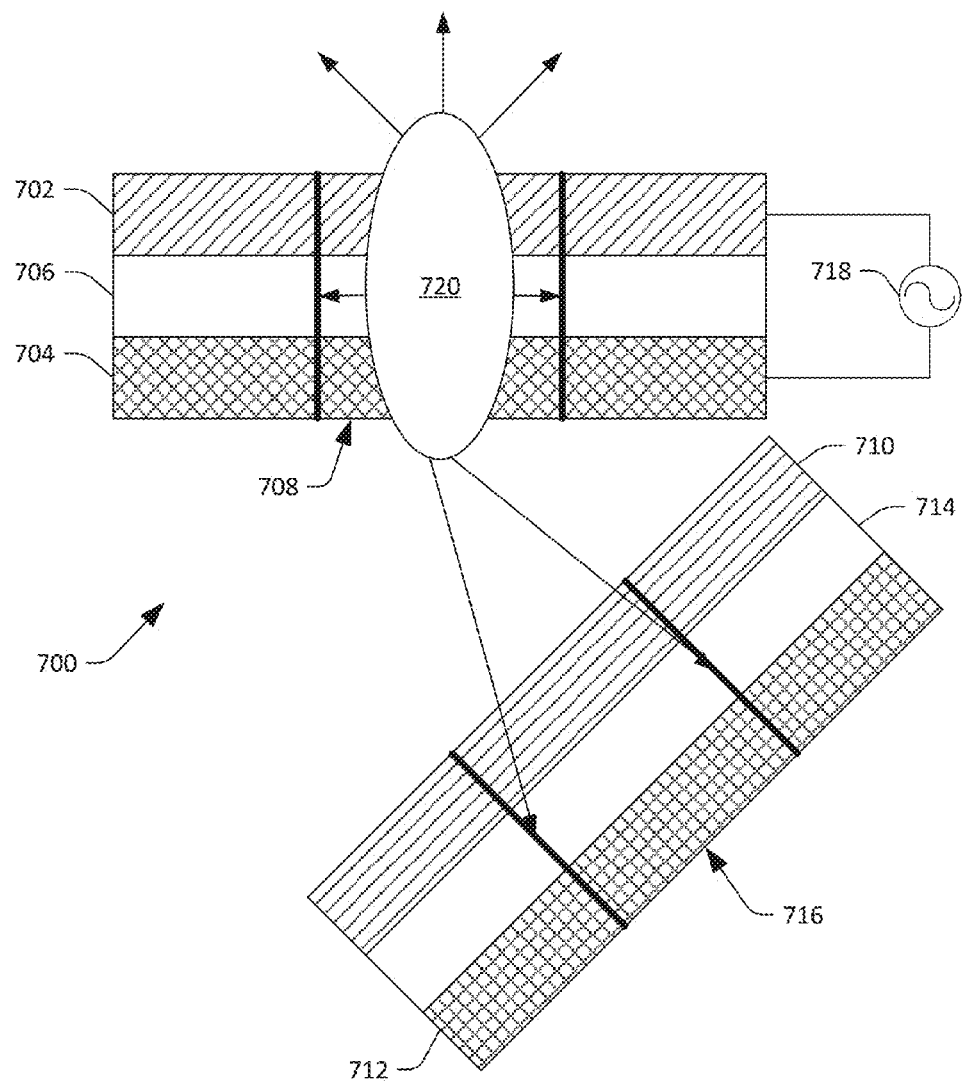
FIG. 7 is a cross-sectional view of another exemplary apparatus that includes a varactor.

Now referring to FIG. 7, yet another exemplary apparatus 700 is illustrated. In previous examples, apparatus with integrated varactors and micro-discharge sources have been illustrated as including multiple np junctions, where one of such np junctions acts as a micro-discharge source and the other acts as a varactor element, and further where the micro-discharge source and varactor element are axially aligned with one another. FIG. 7 illustrates another exemplary embodiment, where axes of apertures extending through np junctions are misaligned (e.g., the np junction functioning as a varactor may be formed perpendicular to the NP junction functioning as a micro-discharge source). In this example, the apparatus 700 includes a layer of n-type material 702, a layer of p-type material 704, and an np junction 706 formed between the layer of n-type 702 and the layer of p-type material 704. The apparatus 700 further includes an aperture 708 that extends through the layer of n-type material 702, the layer p-type material 704, and the np junction 706, wherein a gas is disposed in the aperture 708.

The apparatus 700 also comprises a second layer of n-type material 710, a second layer of p-type material 712, and a second np junction 714 formed between the second layer of n-type material 710 and the second layer of p-type material 712. The apparatus 700 additionally includes a second aperture 716 that extends through the second layer of n-type material 710, the second layer of p-type material 712, and the second np junction 714 (e.g., such that at least a portion of the second np junction 714 is exposed in the second aperture 716). As can be ascertained, an axis of the aperture 708 is misaligned from an axis of the aperture 716. An angle between the axes can be set as a function of a desired amount of light that impacts the surface of the second np junction 714 in the second aperture 716. In a non-limiting example, the axis of the aperture 708 may be perpendicular to the axis of the second aperture 716, although other arrangements are contemplated.

Similar to what has been described above, a voltage source 718 applies a voltage across the np junction 706, resulting in formation of a plasma 720 in the aperture 708. This causes a micro-discharge to occur, wherein photons, charge particles, and space charge are isotropically emitted, at least some of which enter the second aperture 716 and impinge upon the surface of the second np junction 714 in the second aperture 716. This causes capacitance of the second np junction 714 to alter. Thus, the second np junction 714 acts as a varactor element in the apparatus 700.

Figure 8:
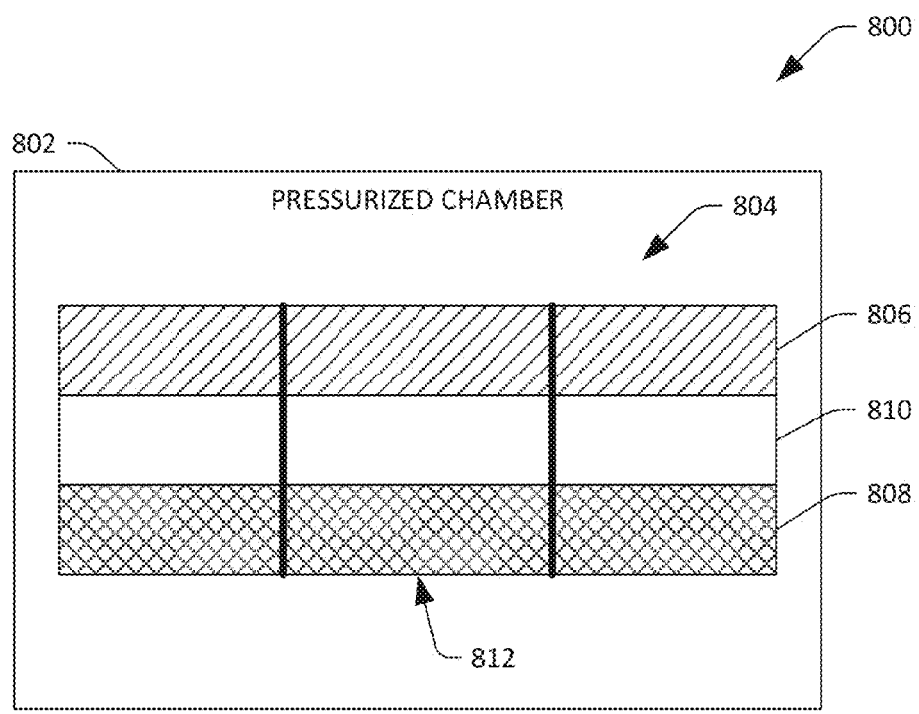
FIG. 8 illustrates an electronic device that includes a varactor.

With reference now to FIG. 8, an exemplary apparatus 800 that includes a varactor is illustrated. The apparatus 800 comprises a pressurized chamber 802 with a varactor 804 enclosed therein. The pressurized chamber 802 can be associated with a particular pressure, which can impact capacitance of the varactor 804. With more particularity, the varactor 804 includes a layer of n-type material 806, a layer of p-type material 808, and an np junction 810 formed between the layer of n-type material 806 and the layer p-type material 808. The apparatus 800 also includes an aperture 812 that extends through the aforementioned layers. It is to be understood that any of the apparatus described herein may be included in the pressurized chamber 802. Utilization of the pressurize chamber 802 also allows for a desired gas to be disposed in the aperture 812, wherein such gas is not readily displaced by air.

Figure 9:
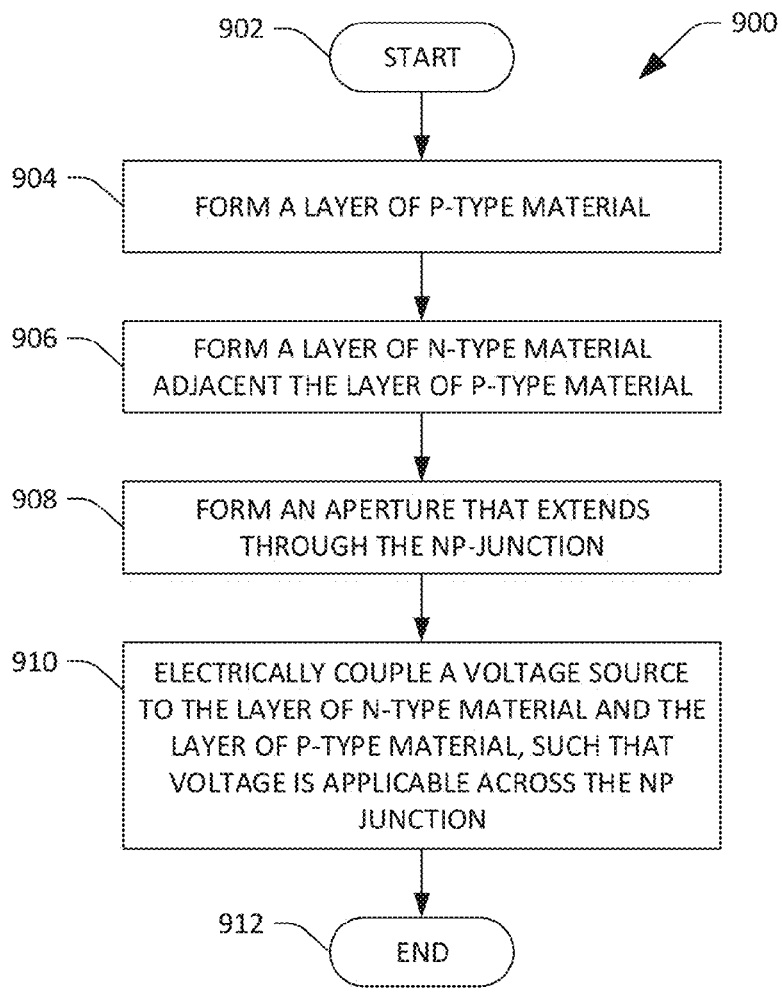
FIG. 9 is a flow diagram that illustrates an exemplary methodology for forming a varactor.
Figure 10:
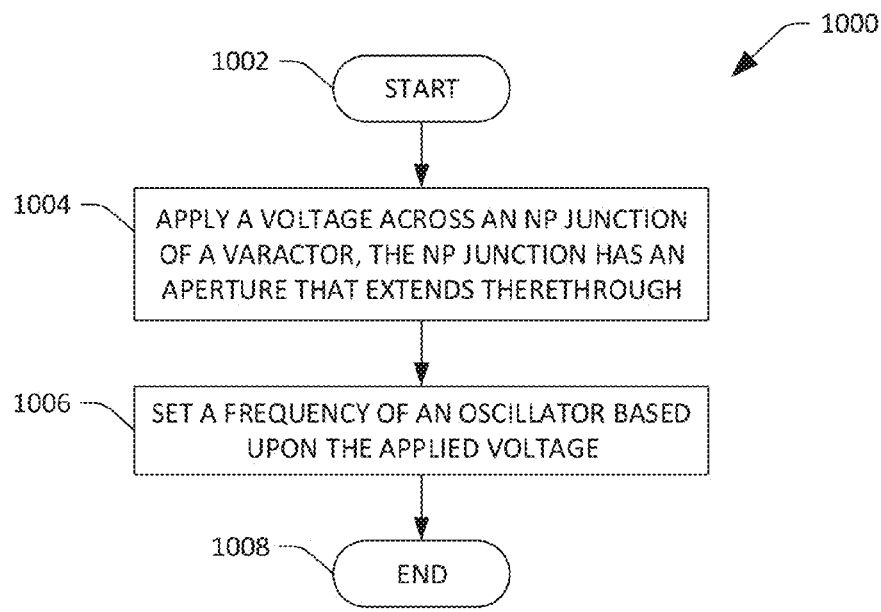
FIG. 10 illustrates an exemplary methodology for setting a resonant frequency of a resonant frequency circuit.

FIGS. 9-10 illustrate exemplary methodologies relating to forming and operation an apparatus that includes a varactor and an integrated micro-discharge source. While the methodologies are shown and described as being a series of acts that are performed in a sequence, it is to be understood and appreciated that the methodologies are not limited by the order of the sequence. For example, some acts can occur in a different order than what is described herein. In addition, an act can occur concurrently with another act. Further, in some instances, not all acts may be required to implement a methodology described herein.

Now referring solely to FIG. 9, an exemplary methodology 900 that facilitates forming a varactor is illustrated. The methodology 900 starts at 902, and at 904, a layer of p-type material is formed. At 906, a layer of n-type material is formed adjacent the layer p-type material, such that in np junction is formed.

At 908, an aperture is formed that extends through the np junction. In an example, suitable semiconductor fabrication techniques can be utilized to form the aperture, such as photolithography, etching, etc. At 910, a voltage source is electrically coupled to the layer of the n-type material and the layer of the p-type material, such that the voltage source is able to apply a voltage across the np junction. As described above, when voltage is applied across the np junction, a micro-discharge can be formed in the aperture, wherein light generated during the micro-discharge can impact the capacitance of the np junction (and/or impact capacitance of another np junction that is proximate the NP junction). The methodology 900 completes at 912.

Referring now to FIG. 10, an exemplary methodology 1000 for setting a frequency of an oscillator circuit is illustrated. The methodology 1000 starts at 1002, and at 1004, a voltage is applied across in np junction of a varactor, wherein the np junction has an aperture that extends there through. Application of the voltage across the np junction results in a micro-discharge occurring in the aperture, wherein light generated in the micro-discharge impacts an exposed portion of an np junction. At 1006, a frequency of an oscillator circuit is set based upon the applied voltage. For example, the micro-discharge is used to alter capacitance of an np junction, wherein such alteration is undertaken to cause the np junction to have a certain capacitance which can be used to set the frequency of the oscillator circuit. The methodology 1000 completes at 1008.

As used herein, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form. Additionally, as used herein, the term "exemplary" is intended to mean serving as an illustration or example of something, and is not intended to indicate a preference, and the term "about" refers to a range of 10% of the value to which the term applies.

All patents, patent applications, publications, technical and/or scholarly articles, and other references cited or referred to herein are in their entirety incorporated herein by reference to the extent allowed by law. The discussion of those references is intended merely to summarize the assertions made therein. No admission is made that any such patents, patent applications, publications or references, or any portion thereof, are relevant, material, or prior art. The right to challenge the accuracy and pertinence of any assertion of such patents, patent applications, publications, and other references as relevant, material, or prior art is specifically reserved.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known structures, devices, and operations have been shown in block diagram form or without detail in order to avoid obscuring the understanding of the description. Where considered appropriate, reference numerals or terminal portions of reference numerals have been repeated among the figures to indicate corresponding or analogous elements, which may optionally have similar characteristics.

What has been described above includes examples of one or more embodiments. It is, of course, not possible to describe every conceivable modification and alteration of the above devices or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

It should also be appreciated that reference throughout this specification to "one embodiment", "an embodiment", "one or more embodiments", or "different embodiments", for example, means that a particular feature may be included in the practice of the invention. Similarly, it should be appreciated that in the description various features are sometimes grouped together in a single embodiment, figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

What is claimed is:

1. An electronic device comprising:
    a layer of p-type material;
    a layer of n-type material;
    an np junction formed between the layer of p-type material and the layer of n-type material;
    an aperture that extends at least partially through the layer of p-type material, at least partially through the layer of n-type material, and entirely through the np junction, wherein a gas is disposed in the aperture; and
    a voltage source that is configured to apply a voltage across the np junction, wherein the gas is converted to plasma responsive to the voltage being applied across the np junction.

2. The electronic device of claim 1, wherein a diode comprises the layer of p-type material, the layer of n-type material, the np junction, and the aperture.

3. The electronic device of claim 1 being a mobile computing device.

4. The electronic device of claim 1 being a semiconductor chip.

5. The electronic device of claim 1, further comprising a plurality of apertures, each aperture in the plurality of apertures extends at least partially through the layer of p-type material, at least partially through the layer of n-type material, and entirely through the np junction.

6. The electronic device of claim 1, further comprising a glass, dielectric, ceramic and/or a semiconductor envelop that surrounds the layer of p-type material, the layer of n-type material, and the np junction.

7. The electronic device of claim 1, further comprising:
    a second layer of p-type material;
    a second layer of n-type material; and
    a second np junction formed between the second layer of p-type material and the second layer of n-type material; wherein the aperture extends at least partially through the second layer of p-type material, at least partially through the second layer of n-type material, and entirely through the second np junction.

8. The electronic device of claim 7, further comprising a layer of dielectric material that has a first side and a second side, the first side is adjacent the layer of n-type material, the second side is adjacent the second layer of n-type material.

9. The electronic device of claim 1, further comprising:
    a second layer of n-type material;
    a second np junction formed between the second layer of n-type material and the layer of p-type material, wherein the aperture extends entirely through the second np junction and at least partially through the second layer of n-type material.

10. The electronic device of claim 1, the layer of p-type material and the layer of n-type material are metal-oxide semiconductors and/or ultra wide bandgap semiconductor material.

11. The electronic device of claim 10, wherein each of the layer of D-type material and the layer of n-type material comprise GaAs, SiO SiC, AlN, or GaN.

12. A method comprising:
    forming a layer of p-type material;
    forming a layer of n-type material adjacent the layer of p-type material, thereby forming an np junction; and
    forming an aperture that extends at least partially through the layer of p-type material, at least partially through the layer of n-type material, and entirely through the np junction, wherein a gas is disposed in the aperture, wherein application of a voltage across the np junction causes photons, charge particles, and space charge to be emitted in the aperture, the photons, charge particles, and space charge cause a capacitance of a varactor to alter when impinging upon a surface of the np junction.

13. The method of claim 12, the layer of p-type material, the layer of n-type material, and the np junction included in the varactor.

14. The method of claim 12, further comprising:
    forming a second layer of n-type material adjacent on an opposite side of the p-type material, thereby forming a second np junction, wherein forming the aperture comprises forming the aperture to extend at least partially through the second layer of n-type material and entirely through the second np junction.

15. The method of claim 14, wherein the second np junction is included in the varactor.

16. The method of claim 15, further comprising applying a second voltage across the second np junction, wherein applying the second voltage further causes the capacitance of the varactor to alter.

17. The method of claim 12, further comprising:
    forming a layer of dielectric material adjacent the layer of n-type material, such that the layer of n-type material is between the layer of dielectric material and the layer of p-type material;
    forming a second layer of n-type material adjacent the layer of dielectric material, such that the layer of dielectric material is between the layer of n-type material and the second layer of n-type material; and forming a second layer of p-type material adjacent the second layer of n-type material thereby forming a second np junction, such that the second layer of n-type material is between the layer of dielectric material and the layer of p-type material, wherein the aperture extends entirely through the layer of n-type material, entirely through the layer dielectric material, entirely through the second layer of n-type material, entirely through the second np junction, and at least partially through the second layer of p-type material.

18. The method of claim 17, further comprising:
applying a second voltage across the second np junction, wherein applying the second voltage further causes the capacitance of the varactor to alter.

19. An electronic device comprising:
a first voltage source;
a second voltage source;
a layer of n-type material;
a layer of p-type material;
an np junction formed between the layer of n-type material and the layer of p-type material, wherein the first voltage source is configured to apply a voltage across the np junction;
a second layer of n-type material;
a second layer of p-type material;
a second np junction formed between the second layer of n-type material and the second layer of p-type material, wherein the second voltage source is configured to apply a second voltage across the second np junction; and
an aperture that extends through the layer of n-type material, the layer of p-type material, the np junction, the second layer of n-type material, the second layer of p-type material, and the second np junction, wherein application of the voltage across the np junction causes an alteration in capacitance of the np junction, and wherein application of the second voltage across the second np junction causes a micro-discharge to occur in the aperture, the micro-discharge further altering capacitance of the np junction.

20. The electronic device of claim 19 being a semiconductor chip.

* * * * *